United States Patent
Yonemori

(10) Patent No.: US 6,609,241 B2
(45) Date of Patent: Aug. 19, 2003

(54) METHOD OF DESIGNING CLOCK WIRING

(75) Inventor: Shigeki Yonemori, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/962,135

(22) Filed: Sep. 26, 2001

(65) Prior Publication Data

US 2002/0038204 A1 Mar. 28, 2002

(30) Foreign Application Priority Data

Sep. 26, 2000 (JP) ........................... 2000/292578

(51) Int. Cl.$^7$ .............................................. G06F 17/50
(52) U.S. Cl. ............................................. 716/12; 716/10
(58) Field of Search ...................................... 716/12, 10

(56) References Cited

U.S. PATENT DOCUMENTS

| 4,839,820 | A | * | 6/1989 | Kinoshita et al. ............ 257/923 |
| 5,397,749 | A | * | 3/1995 | Igarashi ....................... 438/129 |
| 5,778,216 | A | * | 7/1998 | Venkatesh .................... 713/500 |
| 5,880,971 | A | * | 3/1999 | Dangelo et al. ................ 716/6 |
| 5,956,257 | A | * | 9/1999 | Ginetti et al. ................. 716/10 |
| 6,086,629 | A | * | 7/2000 | McGettigan et al. .......... 716/10 |
| 6,223,333 | B1 | * | 4/2001 | Kuribayashi et al. ......... 716/10 |
| 6,249,902 | B1 | * | 6/2001 | Igusa et al. ..................... 716/1 |
| 6,266,803 | B1 | * | 7/2001 | Scherer et al. ................ 716/10 |
| 6,275,973 | B1 | * | 8/2001 | Wein ........................... 716/10 |
| 6,289,494 | B1 | * | 9/2001 | Sample et al. ................ 716/12 |

FOREIGN PATENT DOCUMENTS

| JP | 04-148376 | 5/1992 |
| JP | 2000-286342 | 10/2000 |

OTHER PUBLICATIONS

Masakazu Yamashina, "Prospect of Sub–Quarter Micron LSI Design", *Technical Report of IEICE*, VLD97–77, ICD97–173, CPSY97–66, FTS97–40 (Oct. 1997), pp. 11–18.

* cited by examiner

Primary Examiner—Matthew Smith
Assistant Examiner—Andrea Liu
(74) Attorney, Agent, or Firm—Sughrue Mion, PLLC

(57) ABSTRACT

A delay model of a macro is prepared in advance, and a delay of a top level is calculated using the delay model, to thereby reduce the clock skews between the respective macros to which clocks are supplied, within a functional block being designed.

28 Claims, 8 Drawing Sheets

METHOD OF DESIGNING CLOCK WIRING

Priority is claimed from Japanese Patent Application No. 2000-292578 filed Sep. 26, 2000, the contents of which are incorporated herein by reference.

BACKGROUND OF THE INVENTION

1. Field of the Invention

The present invention generally relates to relates to a method of designing a clock wiring, and more particularly, but not limited to, a method of designing a clock wiring, where a layout design makes a function block hierarchical. The present application is based on Japanese Patent Application No. 292578/2000, which is incorporated herein by reference.

2. Description of the Related Art

With the advance of semiconductor technology in recent years, an LSI (large-scaled semiconductor integrated circuit) is becoming increasingly high in speed, high in integration, and high in scale. In particular, in a logic circuit, an LSI chip is designed by a so-called deep sub micron design rule of 0.35 µm or less. There are many high integrated chips using clock frequencies in a range from several hundreds MHz to several GHz.

In the high-speed LSI of this type, it is important to reduce a difference in a clock delay time between functional circuits which causes malfunction, that is, a clock skew.

Generally, as a method of designing a clock transmission wiring (hereinafter referred to as "clock wiring" or "clock wiring method"), a method has been employed that includes conducting a clock tree synthesis from an output terminal of a clock generating circuit to a cell group, which is a functional block to which a clock is supplied. However, an increase in the scale of LSI devices in recent years results in an increase in the number of processes for conducting a layout design and a processing period thereof, so that the conventional design method includes a huge number of processes and a long processing time for designing a single layout.

As is well known, the LSI design process is roughly divided into a functional design for designing the operation to be realized by a functional block having functional parts, a logic design for converting the functional block into a logic circuit, and a layout design for converting the logic circuit into a mask pattern.

When the layout design of the LSI chip takes a wiring delay time into consideration, there is widely employed a layout design method which is a so-called top down system, in which the functional block is made hierarchical.

The functional block is conventionally separated into two hierarchies, a superior hierarchy (hereinafter referred to as "top level") and an inferior hierarchy (hereinafter referred to as "macro"). A hierarchy design process for obtaining the layouts within each of the top level and the macro, individually, is first used to obtain the layout of the top level.

In order to develop the LSI at a low cost and in a short period of time, it is necessary to reduce the clock skew in the case of conducting the layout design method of the top down system.

Referring to FIGS. 1A to 1C, showing a first conventional method of designing a clock wiring disclosed in Japanese Patent Application Laid-open No. Hei 4-148376, the functional block, to which the clock wiring is applied, includes an output block 1 of a clock net and two macros 2, 3, where top level wirings are clock wirings from the output block 1 of the clock net to two macros 2 and 3. Initially, straight lines 7 and 8, connecting an output terminal (hereinafter referred to as "clock output terminal") 11 disposed in the output block 1 of a clock net to the respective centers 25 and 35 of macros 2 and 3, are drawn to obtain cross points 201 and 301 of the straight lines 7, 8 and to obtain the respective peripheral edges of the macros 2 and 3.

Then, as shown in FIG. 1B, the cross points 201 and 302 on the peripheral edges of the macros 2 and 3 are obtained on the basis of the longest distance between the clock output terminal 11 and the crosses on the peripheral edges of the macros 2 and 3. Finally, the arranging process and the wiring process within the macro are conducted with the cross points 201 and 302 being used as the respective outer (clock) terminal positions of the macros 2 and 3, as shown in FIG. 1C. Through the above processes, the wirings between the clock output terminal 11 and the respective clock terminals (cross points) 201 and 302 of the macros 2 and 3 become equal in length to each other. When cells are arranged within the respective macros 2 and 3, the cells 203 and 303 connected to the clock terminals 201 and 302 (hereinafter referred to as "clock terminal connection cells") are disposed in the vicinity of the clock terminals 201 and 302, to thereby make the respective distances from the clock output terminal 11 to the clock terminal connection cells 203 and 303, of the respective internal clock terminals 201 and 302, equal to each other, thereby eliminating the clock skew.

However, in the first conventional clock wiring designing method, because no input/output separation buffer is added in the vicinity of the clock terminal, and because a delay model of the macro per se is not produced, the delay calculation of the top level, which is necessary for the layout design of the top down system, cannot be conducted with a high precision. The delay calculation of the top level means a delay calculation between the clock output terminal 11 and the respective clock terminal 201 and 302.

Namely, in the case where the clock wirings of the top level are made equal in length to each other, delay values from the clock output terminal 11 to the respective clock terminals 201 and 302 are different from each other due to a difference in the capacitance between the adjacent wirings caused by a difference of the wirings adjacent to the clock wiring, etc. As a result, even if the clock terminal connection cells 203 and 303 are arranged in the vicinity of the terminals 201 and 302 when the arrangement within the macro is conducted, the respective clock delays, of the clock output terminal 11 and a plurality of clock terminal connection cells 203 and 303 within the macro, are not equal to each other, and the clock skew may be large.

Also, in the case of conducting the delay calculation of the top level, because the functional block (cell) within the macro is not yet arranged, the delay calculation of the top level, which takes into consideration the accurate load after the arrangement within the macro is wired, cannot be conducted.

The flowchart of FIG. 2 illustrates a second conventional method of designing the clock wiring. A macro arrangement is first conducted (Step P1), and the terminal position of the top level is determined (Step P2). Then, the CTS (clock tree synthesis) of the top level is conducted, so that the clock skewings between the clock output terminal and the respective clock terminals of the macros coincide with each other (Step P3), the arrangement of the top level is implemented (Step P4), and the information on the resistors R and the capacitors C of the respective wirings (hereinafter referred to as "RC information") F101 is extracted.

After Step P2, the arrangements within the respective macros are conducted (Step P11), the CTS within the macros is conducted so that the respective macro delays become equal to each other (Step P12), the wiring within the macros is implemented (Step P13), and an information of a resistance and a capacitance (hereinafter a RC information) F102 of the respective wirings within the macro is extracted.

The static timing, between the clock output terminal and the clock terminal connection cell within the macro, is determined on the basis of the RC information F101 and F102 (Step P5), and it is confirmed whether the clock skew is within a given standard value or not (Step P6).

If the confirmation result in step P6 is not acceptable, the delay is adjusted by changing the drive capability of a buffer added to the CTS and adding the buffer or the like (Step P6), and Steps P5 and P6 are conducted again.

When the confirmation result in step P6 is acceptable, the clock wiring is completed.

In a second conventional method of designing the clock wiring, when the CTS within the top level (Step P3) and the CTS within the macro (Step P12) are implemented, a load within the macro is not determined.

For that reason, the following events occur. That is, the input terminal capacitance of the buffer with the maximum drive capability is loaded to conduct the CTS of the top level, the timing is analyzed after the layouts within the top level and the macro are completed, and, if the clock skew is not acceptable, the delay is adjusted by changing the drive capability of the buffer added in the CTS, adding the buffer or the like, as described above. Then, the timing is analyzed again, and the clock skew is confirmed.

As a result, it is necessary to conduct a plurality of timing analyses after the layout is completed, in addition to an analysis after the change of the buffer drive capability and the change of the layout for buffer addition, and the number of processes and the processing time increase.

Further, in a third conventional method of designing the clock wiring for deleting the clock skew, the most superior layer is set as an exclusive clock wiring layer and a capacitance between the adjacent wirings is reduced to reduce the clock skew.

However, because the third conventional clock wiring designing method always requires the exclusive clock wiring layer, even in the case where the wiring congestion caused by implementing the clock wiring does not occur, it is necessary to increase the number of wiring layers only for the clock. As a result, the number of wiring layers which are not always required increases to thereby increase the costs.

In the above-described first conventional method of designing the clock wiring, because no input/output separation buffer is added in the vicinity of the clock terminal, and no delay model of the macro per se is prepared, the delay of the top level, which is necessary for the layout design of the top down system, cannot be calculated with a high precision. As a result, even in the case where the clock wirings of the top level are made equal in length to each other, the delay values of from the clock output terminal to the clock terminals of the respective macros are different due to a difference in the capacitance between the adjacent wirings connected to the clock wiring. Thus, even if the clock terminal connection cell is disposed in the vicinity of the terminal when the arrangement within the macro is conducted, the respective clock delays between the clock output terminal and a plurality of clock terminal connection cells within the macro are not made equal to each other, to thereby lead to a defect that the clock skew may be increased.

Also, in the case where the top level delay is calculated, because the functional block within the macro is not arranged, there is a defect that the delay of the top level cannot be calculated taking into consideration the accurate load after the arrangement within the macro is wired.

Further, in the second conventional clock wiring designing method, the load within the macro is not determined at the time of implementing the CTS within the top level and the macro. Therefore, in the case where the clock skew is not acceptable, as a result of analyzing the timing and confirming the clock skew after the layout within the top level and the macro, because the delay is adjusted by changing the drive capability of the buffer added to the CTS, because the buffer or the like is added, and because the timing analysis and the clock skew confirmation are conducted again, it is necessary to conduct a plurality of timing analyses after the layout is completed in addition to the analyses after the change of the buffer drive capability and the change of the layout for buffer addition. As a result, the number of processes and the processing time increase.

In addition, because the third conventional clock wiring designing method requires the layer only for the clock wiring, even in the case where the wiring congestion caused by implementing the clock wiring does not occur, it is necessary to increase the number of wiring layers only for the clock. As a result, the number of wiring layers which are not always required increase to thereby increases the costs.

A method of designing a clock wiring, which does not require a plural number of timing analyses after changing or completing a layout, and which is capable of lessening the clock skew without using an exclusive clock wiring layer, is needed.

SUMMARY OF THE INVENTION

According to a first aspect of the present invention, there is provided a method of designing a clock wiring, in the LSI layout design of a top down system in which a functional block is sectioned into two hierarchies, consisting of a top level which is a superior hierarchy and a macro which is an inferior hierarchy. The layout of the top level is first conducted by using a hierarchy designing method that conducts the respective layouts within the top level and the macro, individually, characterized in that a delay model of the macro is prepared in advance, and characterized in that the delay of the top level is calculated by using the delay model, to thereby reduce the clock skews between a plurality of macros to which clocks are supplied, within the functional block to be designed.

According to a second aspect of the present invention, there is provided a method of designing a clock wiring, in which the delay model of the macro is prepared by adding the buffer logic of a library cell to a clock terminal description in a net list within the macro, and in which a buffer of the same drive capability corresponding to the buffer logic is disposed in the vicinity of the clock terminal at the time of layout of the macro.

According to a third aspect of the present invention, there is provided a method of designing a clock wiring in the LSI layout design of a top down system, in which a functional block is sectioned into two hierarchies, consisting of a top level which is a superior hierarchy and a macro which is an inferior hierarchy. The layout of the top level is first conducted by using a hierarchy designing manner that performs the respective layouts within the top level and the macro, individually, the method including:

a macro clock terminal determining step of setting a clock terminal that receives the supply of the respective clocks of the non-arranged first and second macros, where the arrangement within the macro is not wired;

a wiring path determining step of determining a wiring path by performing rough wiring between the clock output terminal, and the respective first and second clock terminals set in the macro clock terminal determining step;

a top level wiring step of extracting RC information, which is information on the resistors and capacitors of the respective wirings, by wiring the clock output terminal and the respective first and second clock terminals on the basis of the wiring path determined in the wiring path determining step;

a delay model preparing step of preparing the respective delay models of the first and second macros;

a top level delay calculating step of analyzing the static timing, between the clock output terminal and the respective first and second clock terminals, on the basis of the RC information and the delay model, in order to calculate first and second delay values, which are clock delay values between the clock output terminal and the respective first and second macros;

a delay difference calculating step of calculating clock delay differences between the clock output terminal, and the respective first and second macros obtained from the first and second delay values;

a buffer arranging step of arranging the buffer, of the same drive capacity corresponding to a buffer logic, in the vicinity of the respective first and second clock terminals at the time of layout within the respective first and second macros;

an in-macro arranging step of arranging the first and second macros, respectively; and an in-macro clock arranging step of performing a clock wiring by a clock tree synthesization within the respective first and second macros based on the clock delay difference.

According to a fourth aspect of the present invention, there is provided a method of designing a clock wiring, in which the macro clock terminal determining step draws first and second straight lines that connect the clock output terminal of an output block to the respective centers of the first and second macros to obtain first and second cross points, which are cross points of the first and second straight lines and the respective peripheral edges of the first and second macros. The macro clock terminal determining step also sets the respective first and second clock terminals of the first and second macros to the respective first and second cross points, respectively.

Further, according to a fifth aspect of the present invention, there is provided a method of designing a clock wiring by providing a delay model. A delay model preparing step adds the buffer logic of a cell group in a library cell descriptive file to the clock terminal in the in-macro net list within the first and second macros.

Further, according to a sixth aspect of the present invention, there is provided a method of designing a clock wiring, in which the functional block includes:

a clock net including an output block with a clock output terminal for a clock output;

a first and second macros including first and second clock terminals for the clock input; and clock wirings extending to the first and second macros from the output block which is the top level wiring.

According to a seventh aspect of the present invention, there is provided a method of designing a clock wiring in the LSI layout design of the top down system, in which a functional block is sectioned into two hierarchies consisting of a top level which is a superior hierarchy, and a macro which is an inferior hierarchy. The sectioning provides hierarchy, and the layout of the top level is first conducted by using a hierarchy designing procedure that conducts the respective layouts within the top level and the macro, individually, the method comprising:

a clock terminal determining step of setting a clock terminal that receives the supply of the respective clocks of the non-arranged first and second macros, where the arrangement within the macro is not wired, and where an already-arranged third macro is an arrangement within the macro that has been wired;

a wiring path determining step of determining a wiring path by performing rough wiring between the clock output terminal and the respective first, second and third clock terminals which were set in said clock terminal determining step;

a top level wiring step of extracting RC information, which is information on the resistors and capacitors of respective wirings, by wiring between the clock output terminal and the respective first and second clock terminals on the basis of the wiring path determined in the wiring path determining step;

a delay model preparing step of preparing respective delay models of the first and second macros, and extracting a delay value of the third macro from third macro wiring information in order to prepare a delay model including a third macro delay value;

a top level delay calculating step of analyzing the static timing between the clock output terminal and the respective first and second clock terminals on the basis of the RC information and the delay model, in order to calculate first and second delay values, which are clock delay values between the clock output terminal and the respective first and second macros;

a delay difference calculating step of calculating clock delay differences between the clock output terminal and the respective first and second macros using said first and second delay values;

a buffer arranging step of arranging the buffer of a same drive capacity, corresponding to a buffer logic in the vicinity of the respective first and second clock terminals at the time of layout, within the respective first and second macros;

an in-macro arranging step of arranging the first and second macros so that the delay value between the cell group within the third macro and the clock output terminal becomes equal to each corresponding delay value for the first and second macro; and an in-macro clock wiring step of performing a clock wiring using a clock tree synthesizing method within the first and second macros, based on the clock delay difference.

Still further, according to an eighth aspect of the present invention, there is provided a method of designing a clock wiring in which the functional block includes:

a clock net including an output block that uses the clock output terminal for a clock output;

first and second macros that use the first and second clock terminals for the clock input, and for the already-arranged third macro with an arrangement that has been wired within the macro having a third clock terminal; and clock wirings extending to the first, second and third macros from the output block which is said top level wiring.

Yet still further, according to a ninth aspect of the present invention, there is provided a method of designing a clock wiring, in which the clock wiring uses third buffers for driving the first and second buffers, the clock wiring being added to the respective first and second clock terminals by being inserted between the clock output terminal and the first and second clock terminals.

Yet still further, according to another embodiment of the present invention, there is provided a method of designing a clock wiring, in which said functional block includes:

a clock net including an output block with the clock output terminal being used for a clock output;

where the first and second macros use the first and second clock terminals for the clock input, respectively;

clock wirings extending to the first and second macros from the output block which is the top level wiring; and a control circuit for outputting a control signal in accordance with the setting of a predetermined operating condition;

wherein the clock wiring includes a logic circuit for stopping the passing of the clock in accordance with a supply of the control signal to one or both input sides of the first and second macros.

BRIEF DESCRIPTION OF THE DRAWINGS

Features of the illustrative, non-limiting embodiments of the present invention will be more apparent from the following description taken in conjunction with the accompanying drawings, in which.

BRIEF DESCRIPTION OF THE EMBODIMENTS

The following description of the embodiments discloses specific configurations, features, and operations. However, the embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, features, and operations of the present invention that would have been known to one skilled in the art are omitted for the sake of clarity and brevity.

A method of designing a clock wiring according to a first illustrative embodiment is directed to a method of designing a clock wiring in the LSI layout design of a top down system in which a functional block is sectioned into two hierarchies, consisting of a superior hierarchy (hereinafter referred to as "top level") and an inferior hierarchy (hereinafter referred to as "macro"). The sectioning provides hierarchy, where the layout of the top level is first conducted by using a hierarchy designing operation that performs the respective layouts within the top level and the macro, individually. A delay model of the macro is prepared in advance, and the delay of the top level is accurately calculated by using the delay model, to thereby reduce the clock skews between a plurality of macros to which clocks are supplied within the functional block being designed.

In the macro to which a clock is supplied, a buffer logic of a library cell descriptive file, which is a buffer cell that is prepared as a library, is added to a clock terminal listing in a net list within the macro in order to prepare a delay model.

At the time of layout of the macro, a buffer (hereinafter referred to as "clock buffer"), having a drive capacity corresponding to the buffer logic added to the clock terminal in the net list within the macro, is disposed in the vicinity of the clock. The manner of arranging the clock buffer and the delay model of the macro, when conducting the layout within the macro, has an effect such that a load at the clock terminal within the macro, which performs the delay calculation of the clock net of the top level, becomes equal to a load at the clock terminal within the macro after layout.

Accordingly, even in the case where the arrangement wiring within the macro is not completed, a delay calculation equivalent to that in the final layout can be performed, and a clock tree synthesis (hereinafter referred to as "CTS") is performed taking into consideration the delay differences between the macros at the time of executing the CTS, thereby deleting the skews between the cells connected to the output terminals of the clock buffers within the respective macros.

Figure 1A:
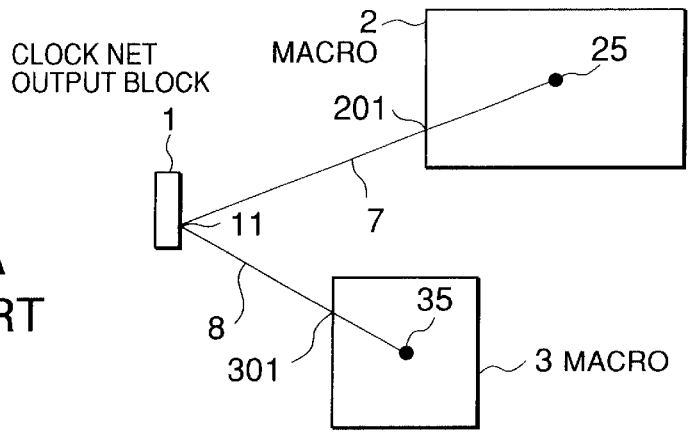
FIGS. 1A–1C are block diagrams schematically showing functional blocks to be applied, determination of a terminal position, and a model of a macro for explaining an example of the operation in a first conventional method of designing a clock wiring.
Figure 1B:
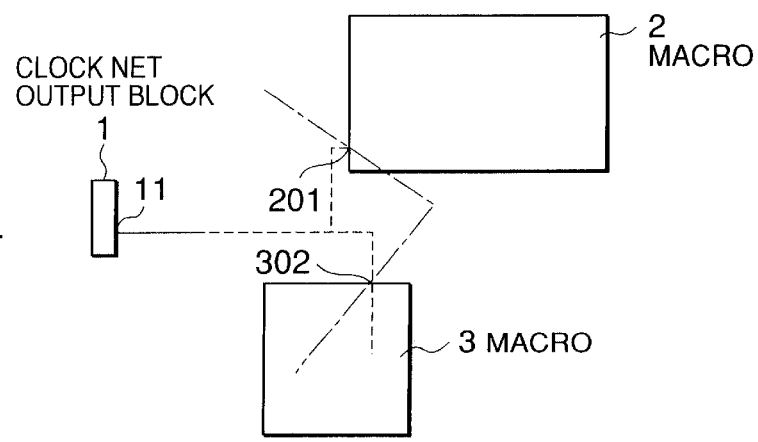
Figure 1C:
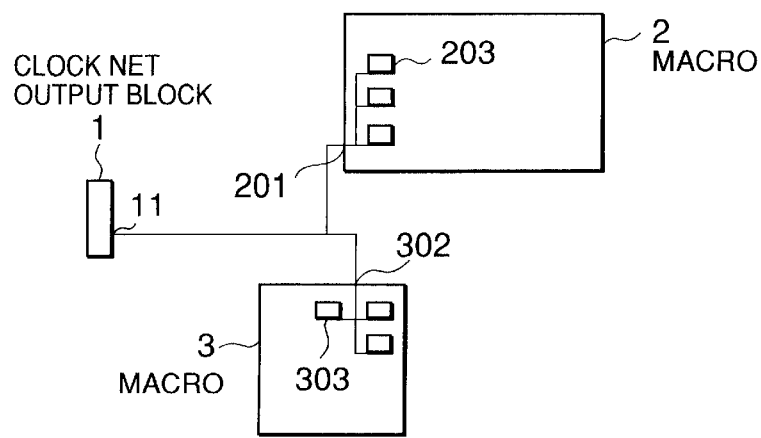
Figure 2:
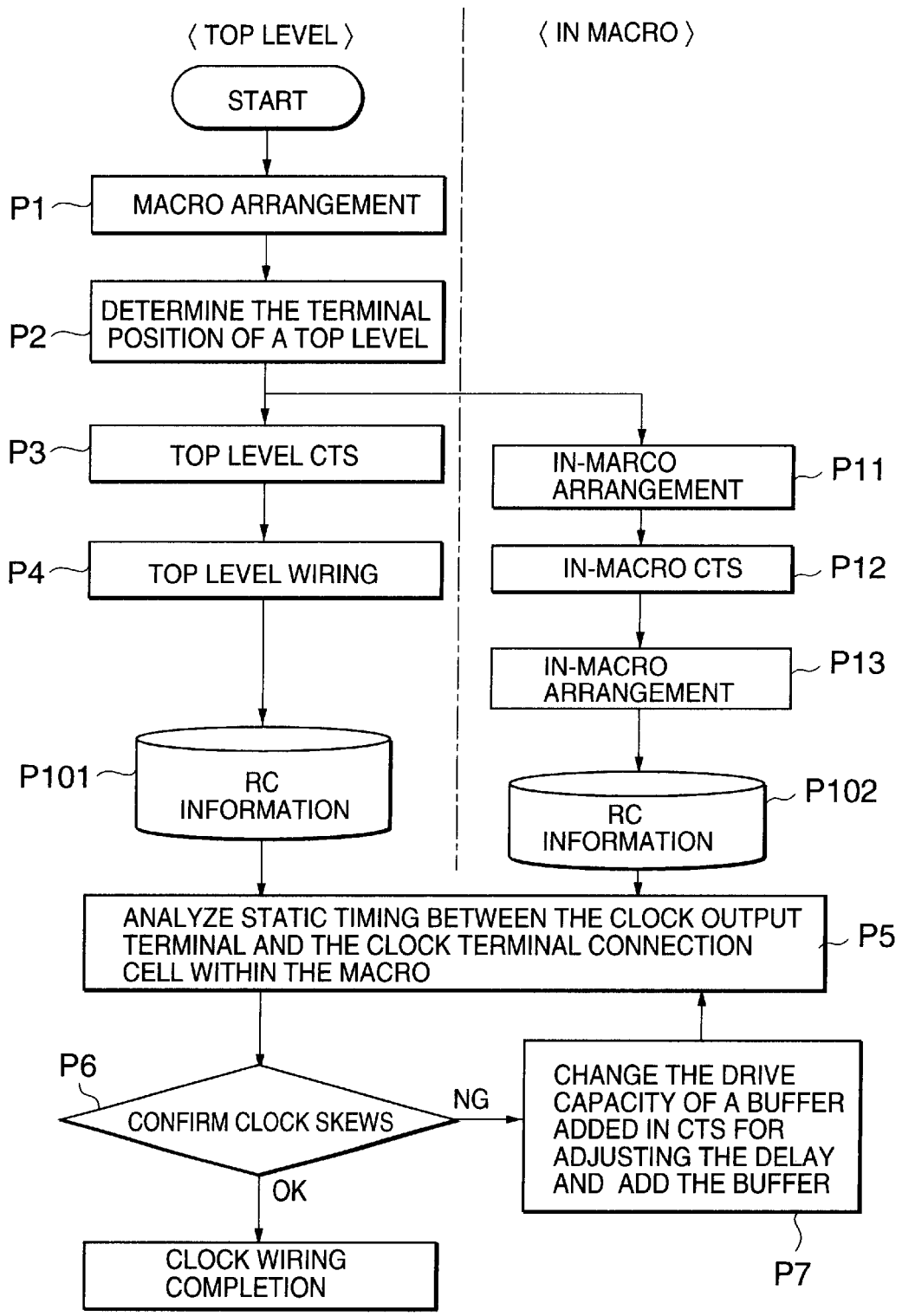
FIG. 2 is a flowchart showing an example of a second conventional method of designing a clock wiring.
Figure 3:
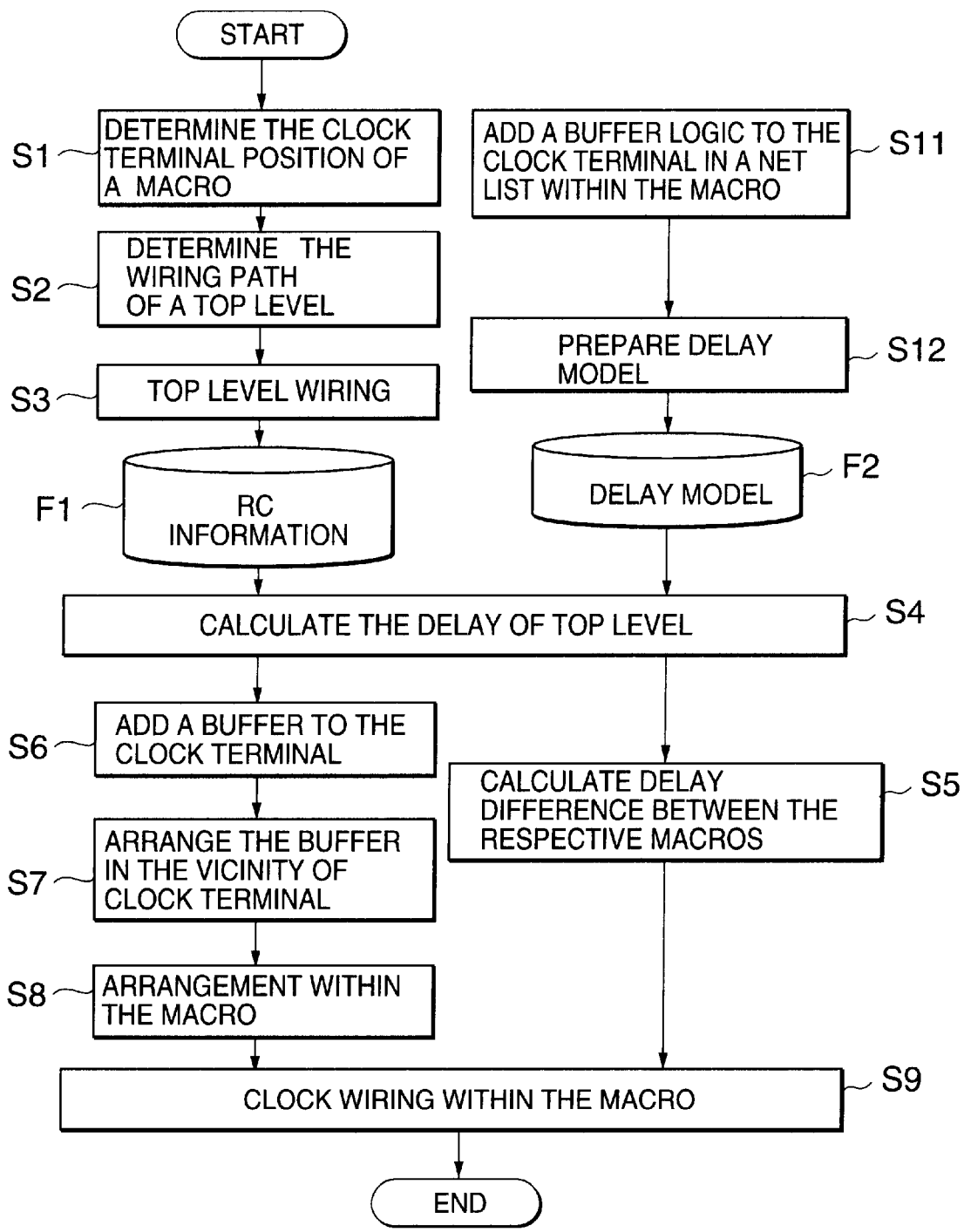
FIG. 3 is a flowchart showing a method of designing a clock wiring in accordance with a first illustrative embodiment of the present invention.

Subsequently, referring to a flowchart of FIG. 3 showing the first embodiment and block diagrams of FIGS. 4A to 4E explaining the operation of this embodiment, the method of designing a clock wiring according to this embodiment first determines the terminal position of the macro, determines the wiring path of the top level, implements the top level wiring and extracts the information (hereinafter referred to as "RC information") F1 on the resistors R and the capacitors C of the respective wirings (Operations S1 to S3).

The buffer logic of the cell group of the library cell descriptive file is added to the clock terminal list, in the net list within the macro, to prepare a delay model F2 of the macro (Operations S11 and S12).

The static timing, between the clock output terminal and the clock terminals of the macros, is analyzed to calculate the delay difference in the clock between the clock output terminal and the respective macros. Also, the buffer, corresponding to the buffer logic, is disposed in the vicinity of a clock terminal when performing the arrangement within the macro. Finally, the CTS wiring, taking the delay difference between the macros into consideration, is implemented from the output terminal of the buffer added to the macro (Operations S4 to S9).

Figure 4A:
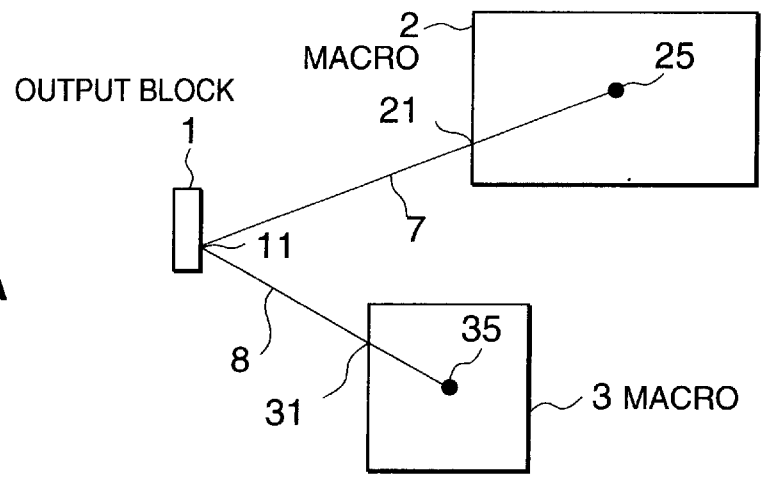
FIGS. 4A–4C are block diagrams schematically showing an example of functional blocks to be applied, a determination of a terminal position, and a model of a macro for explaining an example of the operation in the method of designing a clock wiring according to a first embodiment.
Figure 4B:
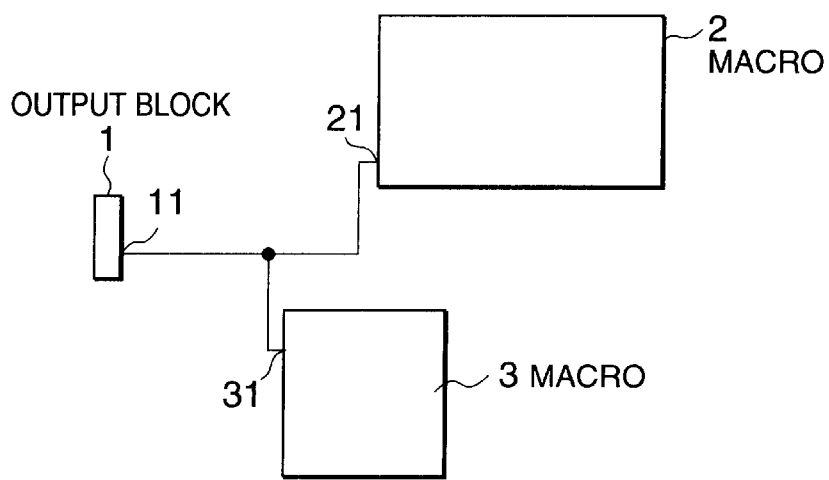

Referring to a block diagram of FIG. 4B showing an example of the functional block to which the method of designing the clock wiring according to this embodiment is applied, the functional block is assumed to be identical to the conventional functional block for convenience of description, and includes a clock net having an output block 1 for a clock output and two non-arranged macros 2 and 3, where the arrangements within the respective macros are not wired. The functional block also includes clock wirings, to those two macros 2, 3 from the output block 1 of the clock net, as the top level wiring.

The output block 1 includes a clock output terminal 11 for the clock signal output, and the respective macros 2, 3 include the clock terminals 21, 31, for the clock signal input, which receive the supply of the clocks from the clock output terminal 11 via the clock wirings.

The respective macros 2, 3 include the cell groups each made up of a plurality of cells (elements). The respective cell groups receive the supply of the clocks through the clock nets, within the macros, connected to the clock terminals 21, 31. However, at this stage, the respective macros 2, 3 have not determined the net lists within those macros 2 and 3, and the cell groups within the macros are not arranged. Therefore, the number of cell groups connected to the clock net within the macro, and the positions of arrangements, are not decided.

Then, the delay from the output terminal 11 to the clock terminal 21 and the delay from the output terminal 11 to the clock terminal 31 is calculated, in order to calculate the delay difference between the delay from the clock output terminal 11 to the clock terminal 21 of the macro 2 and the delay from the clock output terminal 11 to the clock terminal 31 of the macro 3. At the time of executing the delay calculation, the respective loads within those macros 2 and 3 are made identical with the loads existing after the layout, by using the delay model F2 of the macros 2 and 3 that was prepared separately (Operation S12), to thereby calculate the accurate delay of the top level (Operation S4).

A delay difference is calculated from the delay values thus obtained (hereinafter referred to as "the delay values of the macros 2 and 3") between the clock output terminal 11 and the macros 2, 3 (Operation S5), and the CTSs within the respective macros 2 and 3 are performed by using the delay difference (Operation S9).

Figure 4C:
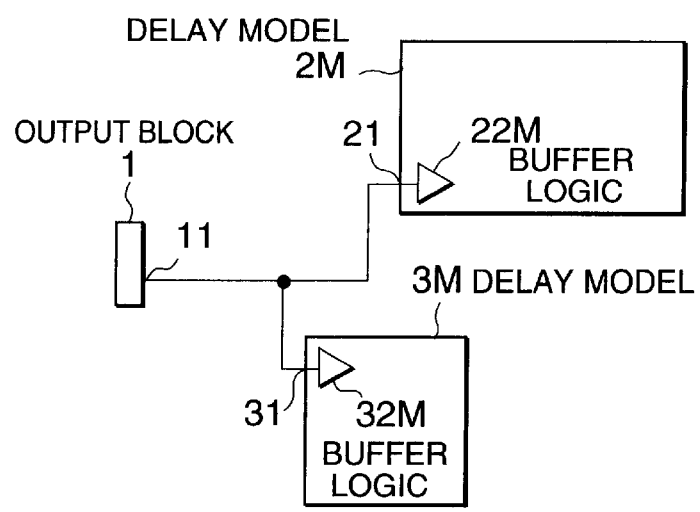

Referring to a block diagram of FIG. 4C showing a functional block, in which the macros 2 and 3 that constitute the functional blocks are made into a delay mode, the delay model 2M of the macro 2 is first prepared by adding the buffer logic 22M, of the minimum driver capacity among the cell group of the library cell descriptive film, to the clock terminal 21 list in the net list within the macro, and the delay 2M is then stored in a delay model (file) F2. Similarly, the buffer logic 32M is added to the clock terminal 31 list of the macro 3, in order to prepare the delay model 3M, and then the delay model 3M is stored in the delay model (file) F2 (Operation S12).

Figure 4D:
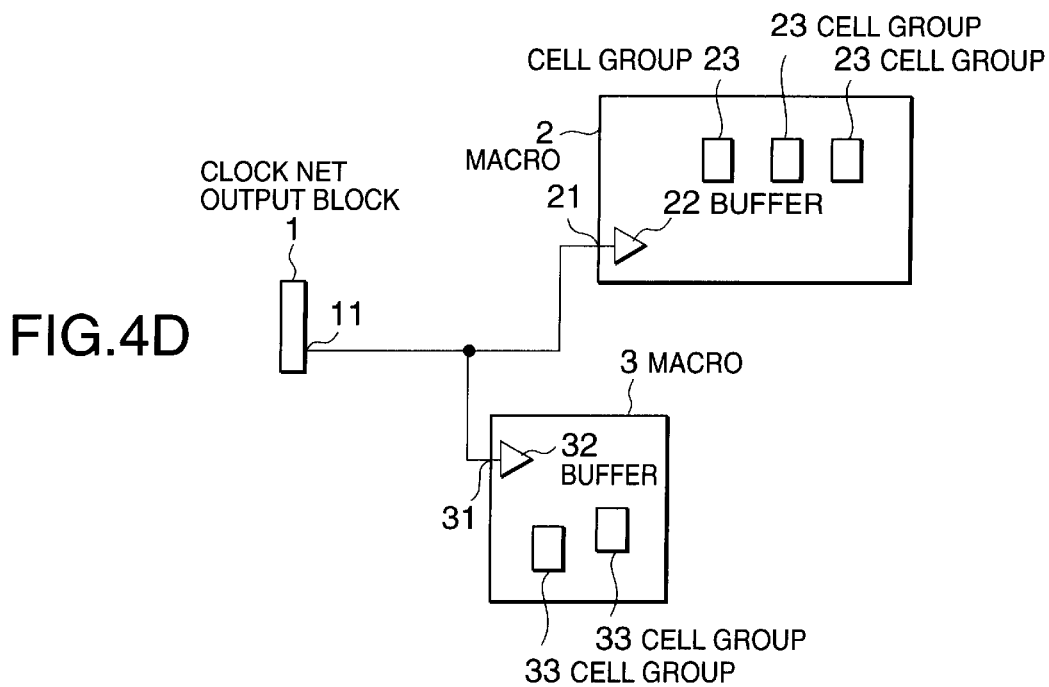
FIGS. 4D and 4E are block diagrams schematically showing a state after the layout within the macro of a first functional block is made, for explaining an operational example in the method of designing a clock wiring according to a first embodiment.
Figure 4E:
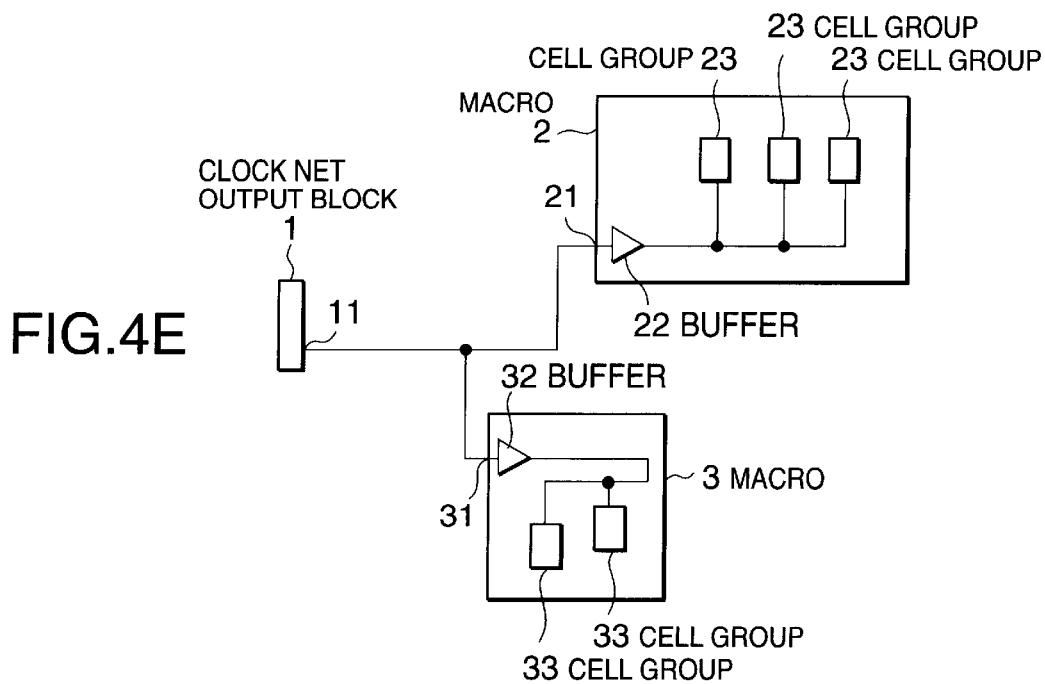

Referring to a block diagram of FIG. 4E showing the state after the layout of the top level, a buffer 22, of the same capacity corresponding to the buffer logic 22M added at the time of preparing the delay model, is arranged in the vicinity of the clock terminal 21 after the layout within the macro 2 (Operations S6 and S7), and the CTSs from the buffer 22 to the cell group 23, connected with the clock net, are performed (Operation S8 and S9). Similarly, a buffer 32, corresponding to the buffer logic 32M is arranged in the vicinity of the clock terminal 31 after the layout within the macro 3, and the CTSs, from the buffer 32 to the cell group 33, are performed.

Since the method of arranging the cell groups 23 and 33 within those macros 2 and 3 utilizes a known technique and is not directly concerned with the present invention, its detailed description will be omitted.

Subsequently, the operation of this embodiment will be described in more detail again with reference to FIGS. 3, and 4A to 4E. First, in Operation S1, in order to conduct the clock wirings from the output block 1 of the clock net to the respective two macros 2 and 3, straight lines 7, 8 that connect the clock output terminal (hereinafter referred to as "clock output terminal") 11 of the output block 1 to the respective centers 25 and 35 of the respective macros 2 and 3 are drawn to obtain cross points of the straight lines 7, 8, and the respective peripheral edges of the macros 2 and 3, and the clock terminals 21 and 31 of the respective macros 2 and 3, are each set to the respective cross points. In this situation, the same processing performed on the clock net may also be performed for respective signal nets, a power supply net, and so on, in order to determine the terminal position as shown in FIG. 4A.

Then, in Operation S2, the rough wiring between the clock output terminal 11 and the clock terminals 21 and 31, which is determined in Operation S1, is performed to determine a wiring path. A this time, the same processing is conducted on the nets, except for the clock nets, in order to determine a wiring path.

Then, in Operation S3, the wiring between the clock output terminal 11 and the clock terminals 21, 31 is performed on the basis of the wiring path determined in Operation S2, as shown in FIG. 4B. In this situation, the same processing is conducted on the nets except for the clock nets in order to conduct wiring, thereby extracting RC information F1.

In Operation S11, the delay models 2M and 3M of the respective macros 2 and 3 are prepared. The delay model 2M of the macro 2 is prepared by adding the buffer logic 22M, of the minimum drive capacity among the cell group of the library cell descriptive file, to the clock terminal 21 list in the net list within the macro where only the clock terminal 21 exists, as shown in FIG. 4C. Similarly, the delay model 3M of the macro 3 is prepared by adding the buffer logic 32M to the clock terminal 31 in the net list within the macro.

Then, in Operation S12, a delay model file F2 that stores the delay models 2M and 3M therein is prepared using the net list prepared in Operation S11.

In Operation S4, the static timing of the clock output terminal 11 and of the clock terminals 21, 31 is analyzed using the delay model file F2 in order to calculate the delay values of the respective paths, thereby calculating the delay of the top level.

In Operation S5, a delay difference between the delay value from the clock output terminal 11 to the clock terminal 21 and the delay value from the clock output terminal 11 to the clock terminal 31 is obtained from the calculated delay value result of the top level of Operation S4.

Then, in Operation S6, in the case of conducting the layout within the macros 2 and 3, the buffers 22 and 32, having the same capacitance corresponding to the buffer logics 22M and 32M added at the time of preparing the delay model, are added to the clock terminals 21 and 31 of the macros 2 and 3, and the respective buffers 22 and 32 added in Operation S7 are arranged in the vicinity of the respective clock terminals 21 and 31, FIG. 4C.

Then, in Operation S8, the arrangement within the macro is performed, as shown in FIG. 4D. The cell group 23 represents a cell that exists within the macro 2, and is connected to the output terminal of the buffer added to the clock terminal 21. Also, the cell group 12 represents a cell group that exists within the macro 3, and is connected to the output terminal of the buffer added to the clock terminal 31.

Then, in Operation S9, the clock wiring within the macros 2 and 3 is performed. Since the delay difference between the respective macro terminals 21 and 31 is calculated in Operation S5, the wiring between the clock terminal 21 and the cell group 23, and the wiring between the clock terminal 31 and the cell terminal 33, each perform the CTS wiring taking its delay difference into consideration, respectively, as shown in FIG. 4E.

In this manner, the delay between the clock terminal 11 and the cell group 23 and the delay between the clock terminal 11 and the cell group 33 become equal to each other, thereby reducing the clock skew.

Also, in the case where the cell group 23, which exists within the macro 2 is changed after the layouts within the macros 2 and 3 are completed, and re-layout within the macro 2 is performed, because the delay value of the superior hierarchy is not changed by adding the buffer 22 to the clock terminal 21 within the macro and arranging the buffer 22 in the vicinity of the clock terminal 21, it is not necessity to change the top level and the macro 3.

In addition, the illustrative embodiment of the method of designing the clock wiring remarkably improves a layout design efficiency of a highly integrated LSI.

As the number of elements mountable on the LSI increases, the functional macro is generated, and the functional macro is reused, productivity is improved. However, the present invention also allows for implementing a novel functional macro that is designed from the beginning, whereby the initial stage of design is dealt with as a black box. With the progress of the design, the design is shifted from the black box to a gray box and a white box.

The white box is directed to data that can accurately calculate the number of grids and the number of cells in the net list, including all of necessary functions and characteristics. The black box is directed to data where only terminal information exists. The gray box is directed to an intermediate stage where the black box is shifted to the white box. Because the functional macro is highly diverse, it can estimate the scale and performance from the beginning of a design, enabling the design to start from the gray box. That is, even if inconsistency exists during the progress of designing an entire chip, the method of designing the clock wiring can absorb such inconsistency.

In addition, since a fluctuation of the delay value due to the adjacent wiring capacitance is taken into consideration, the timing is analyzed after the layout, In order to adjust the skew, the drive capability of the buffer is changed and the buffer is added, thereby reducing the number of processes and a processing period of time for conducting the timing analysis again.

Finally, it is unnecessary to use an expensive layer only for the clock wiring, such as a use of six metal layers in order to eliminate the fluctuation of the delay value due to an influence of the adjacent wiring capacitance. Therefore, a cost is reduced.

As a reference document for reducing the costs, there is, for example, Corporate Juridical Persons "Electronic Communication Society", Suigakugiho VLD97-77, ICD97-173, CPSY97-66, FTS87-04 (1997-10) "LSI design technology in Sub-quarter micron times".

Figure 5:
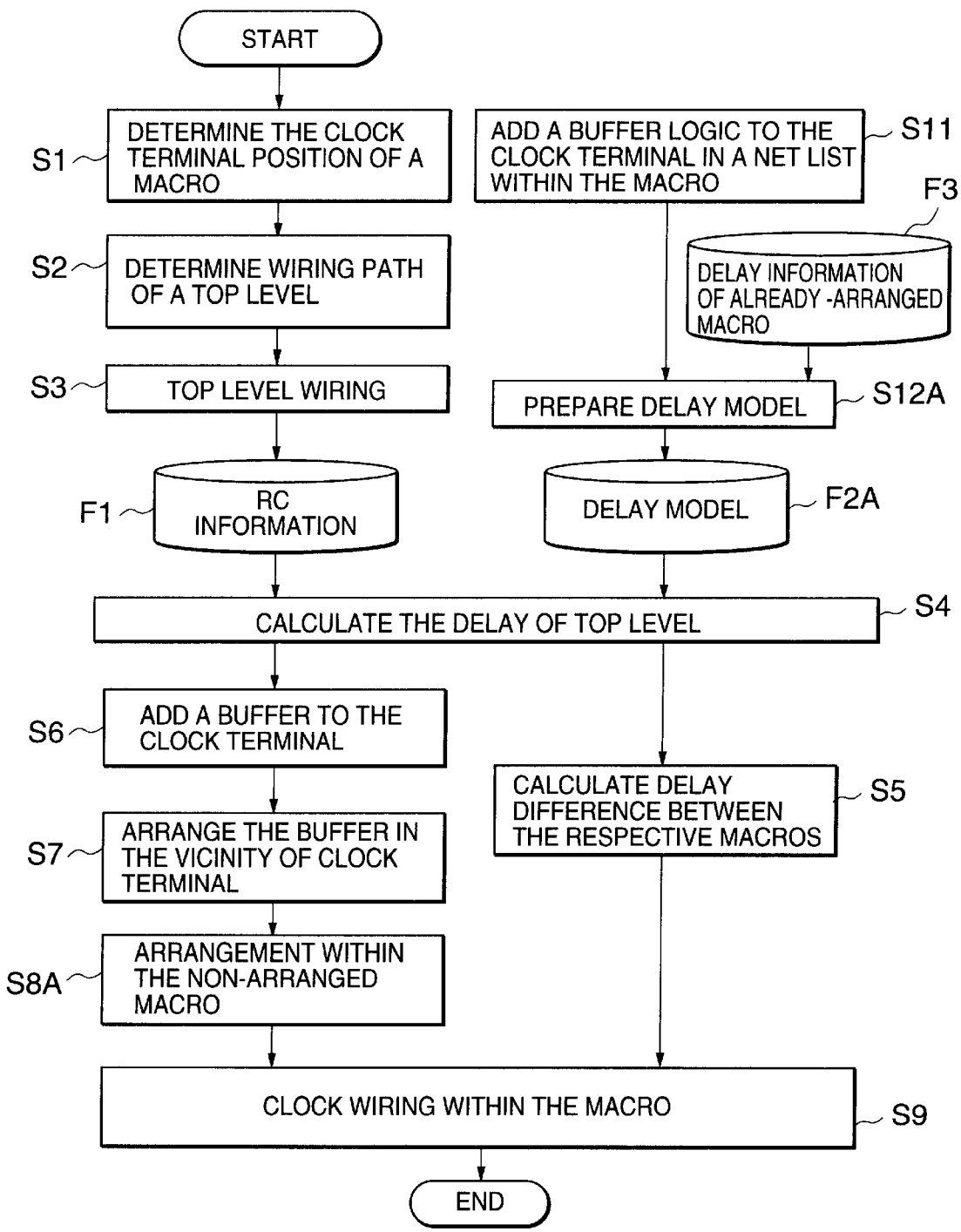
FIG. 5 is a flowchart showing a method of designing a clock wiring in accordance with a second illustrative embodiment of the present invention.

A second illustrative, non-limiting embodiment of the present invention will be described with reference to a flowchart of FIG. 5, where the structural elements common to those in FIG. 3 are denoted by the identical reference characters/numerals. Differences of this second embodiment from the above-described first embodiment include the delay model preparing Operation S12 being replaced by a delay model preparing Operation S12A for extracting the delay value of the already-arranged macro from the wiring information F3 of the already-arranged macro, preparing the delay model F2A including the delay value of the already-arranged macro, the in-macro arranging Operation S8 being replaced by an in-nonarranged-macro arranging Operation S8A for performing an arrangement between the cell group within the macro, where the arrangement within the macro is not yet made, so that the delay value between the cell group with in the macro, where the arrangement in the macro is not yet made, and the clock output terminal of the clock net may be equal to the delay value between the cell group, within the already-arranged macro where the arrangement wiring has been completed, and the clock output terminal of the clock net.

Figure 6:
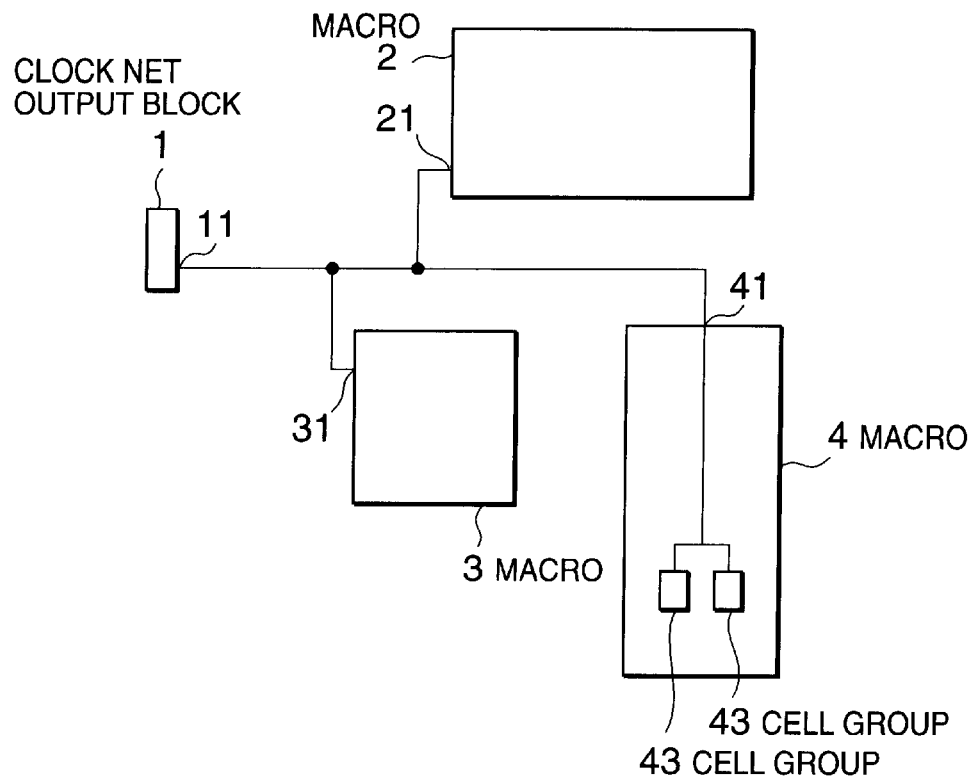
FIG. 6 is a block diagram schematically showing an example of a functional block to be applied in accordance with a second embodiment.

An example of the functional block to which the clock wiring is applied will be described with reference to the block diagram of FIG. 6, where structural elements in common to those in FIGS. 4A to 4E are designated by the identical reference characters/numerals. A difference of this embodiment from the above-described first embodiment resides in that there is further provided a macro 4 which is an already-arranged macro, in which the arrangement wiring has been completed.

In a second embodiment, since the terminal position of the macro 4 is already fixed by the predetermined arrangement, a process of determining the terminal position in Operation S1 is conducted on only the macros 2 and 3. Since the arrangement wiring of the macro 4 is completed, the delay value within the macro 4 is already determined, and the delay calculation is performed taking the delay value, extracted within the macro 4 from the delay information F3 of the already-arranged macro, into consideration, to thereby prepare the delay model F2A that includes the delay value of the macro 4.

Since the delay, between the clock output terminal 11 and the cell group 43 within the macro 4, is already decided, the respective wirings of the clock output terminal 11 and the cell groups 23 and 33 are performed so that the delay values, between the clock output terminal 11 and the cell groups 23 and 33 become equal to the delay values between the clock output terminal 11 and the cell group 43 in Operation S8A.

As a result, even if an arrangement of one macro among the functional blocks has been wired, the delays between the clock terminal 11 and the cell groups 23, 33 and 43 become equal to each other, thereby reducing the skews.

As described above for a second illustrative embodiment, even when an already-arranged macro has an arrangement wiring within a certain macro that is already completed (which is a white box and can deal with a hard macro), a delay of the cell group connected to the clock net within the non-arranged macro is made identical with the delay of the cell group connected to the clock net within the already-arranged macro, thereby reducing the skews after the arrangement wiring has already been completed.

Figure 7:
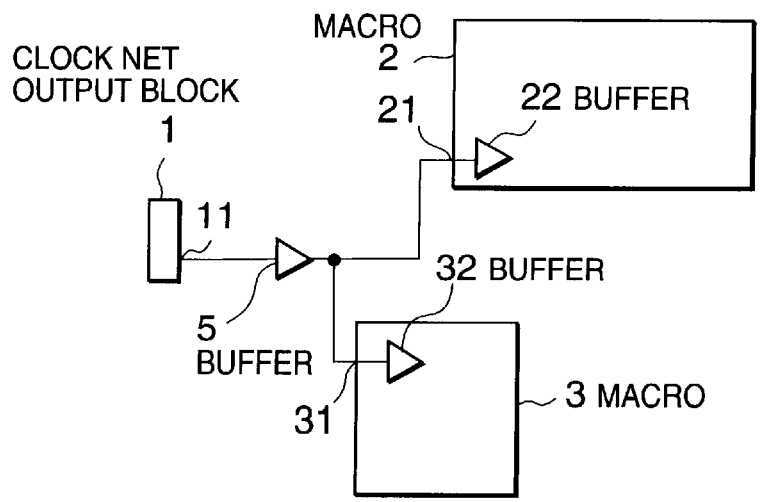
FIG. 7 is a block diagram schematically showing an example of the functional block to be applied in a method of designing a clock wiring in accordance with a third embodiment of the present invention.

An example of the functional block to which the clock wiring is applied according to the third embodiment of the present invention will be described with reference to the block diagram of FIG. 7, wherein structural elements in common to those in FIGS. 4A to 4E are designated by identical reference characters/numerals. A difference of this embodiment from the above-described first embodiment resides in that the buffer 5 is inserted between the clock output terminal 11 and the respective clock terminals 21 and 31 of the macros 2 and 3.

In the case where distances between the clock output terminal 11 and the clock terminals 21 and 31 of the macro are long, and the buffers 22 and 32 added within the macro cannot be driven because of the drive capacitance of the clock net output block 1, a buffer 5 that can sufficiently drive the buffers 22 and 32 is added between the clock output terminal 11 and the respective clock terminals 21 and 31 of the macros 2 and 3. Thereby, performing a delay calculation of the top level as for the first and second embodiments where no buffer 5 is added, reduces the skews after the arrangement is wired.

Also, even in the case where a plurality of buffers exist between the clock output terminal 11 and the clock terminals 21 and 31 of the macros, a delay calculation of the top level can be accurately performed.

As a result, the delay difference of the top level is accurately calculated, and the clock wiring within the macro taking the delay difference into consideration, is performed, thereby reducing the skews.

In addition, even in the case where a cell that inputs a logic for stopping the clock in a predetermined operating condition is added to the clock net, the delay of the top level can be calculated.

Figure 8:
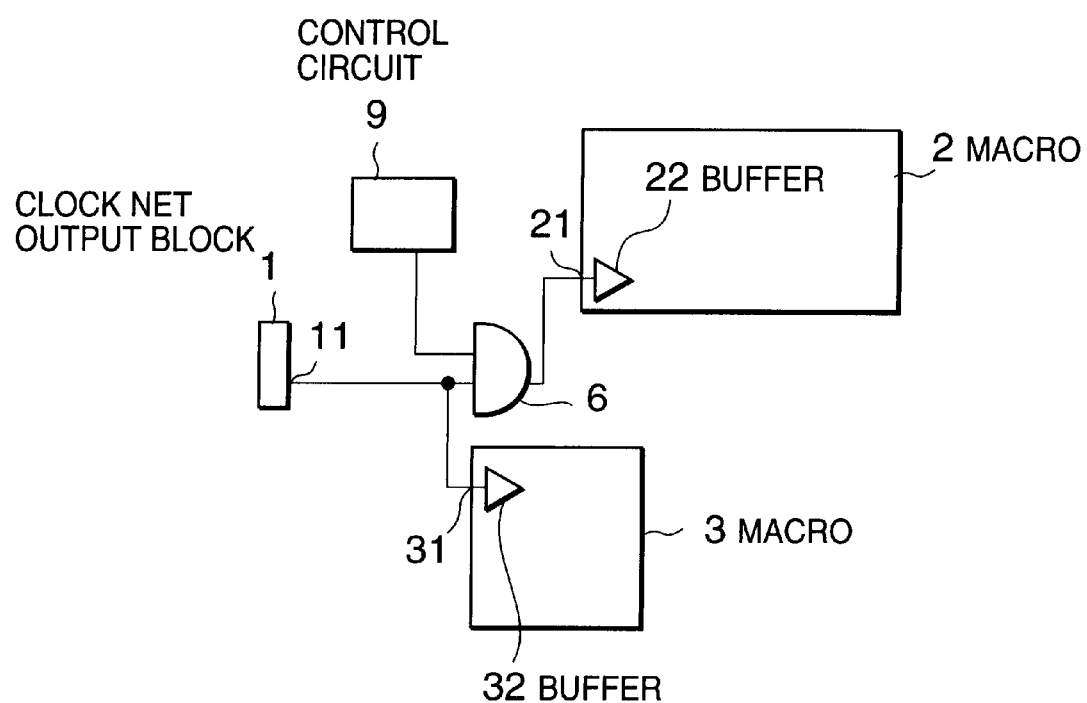
FIG. 8 is a block diagram schematically showing an example of the functional block to be applied in a method of designing a clock wiring in accordance with a fourth embodiment of the present invention.

An example of a functional block to which the above-described power reduction logic is added according to the fourth illustrative non-limiting embodiment of the present invention will be described with reference to the block diagram of FIG. 8, wherein structural elements identical to those in FIGS. 4A to 4E are designated by the identical reference characters/numerals. Differences of this embodiment from the above-described first embodiment reside in that a control circuit 9, for reducing the power in a predetermined operating condition, include setting the predetermined operating condition by fixing a clock signal supplied to the macro 2 to any one of 1 and 0 in the case of stopping the operation of the macro 2, and adding a logic circuit 6 controlled by the control circuit 9 to an input side of the clock terminal 21 of the macro 2.

In this example, an AND circuit is employed as the logic circuit 6, and when the control circuit 9 outputs 0, the logic circuit 6 fixes a clock supplied to the clock terminal 21 at 0, to thereby stop the operation of the macro 2.

The logic circuit 6 may also be disposed at the input side of the clock terminal 31 to stop the operation of the macro 3. The logic circuit 6 may alternatively be disposed at both inputs of the clock terminals 21 and 31 to control the operations of both macros 2 and 3.

In any case, the delay of the top level can be accurately calculated.

Therefore, a delay difference of the top level can be accurately calculated, and performing the clock wiring within the macro takes the delay difference into consideration, thereby reducing the skews.

As described above, in the method of designing the clock wiring according to the illustrative embodiments of the present invention, the delay model of the macro may be prepared in advance, and the delay of the top level may be calculated using the delay model, thereby accurately calculating the clock delays of respective plural macros to which the clock is supplied within the function blocks to be designed. The method thus effects reducing the clock skews between those plural macros.

Also, in the case where the clock wirings of the top level are performed with the same wiring lengths, a fluctuation of delay due to the adjacent wiring capacitance can be taken into consideration, and the clock skews between the macros can be accurately calculated.

Similarly, in the case where the wirings are not performed with the same wiring length, since the clock skews between the macros can be accurately calculated, the values of clock skews between the macros at the top level become accurate, thereby reducing the clock skews after the CTS within the macro has been executed.

Still further, in the case where the layouts within parts of the macros are changed, when a buffer, having the same drive capacitance as the buffer logic added at the time of preparing the delay model, is added to the clock terminal within the macro, and is arranged in the vicinity of the clock terminal at the time of conducting the layout, the delay values, within the top level and the unchanged macro, are not changed. Therefore, it is unnecessary to change the top level and the layout within the unchanged macro, thereby reducing the processing time to conduct the layout again.

Yet still further, the method of designing the clock wiring remarkably improves the layout design efficiency of a highly integrated LSI.

The present invention is not limited to the above embodiments, and it is contemplated that numerous modifications may be made without departing from the spirit and scope of the invention. The method of designing, as described above with reference to the figures, is a merely an exemplary illustration of the invention, and the scope of the invention is not limited to particular embodiments. Accordingly, other structural configurations may be used without departing from the spirit and scope of the invention as defined in the claims.

What is claimed:

1. A method of designing a wiring comprising: classifying a functional block into a top level and a macro, said top level being at a higher level than said macro; arranging a top level wiring connecting said top level and said macro; providing a delay model of said macro; calculating a delay between said top level and said macro based on said delay model; and arranging a macro wiring in said macro based on said delay; wherein said macro comprises a first macro and a second macro, and wherein the step of providing a delay model comprises providing a first delay model corresponding to said first macro and providing a second delay model corresponding to said second macro; defining an output terminal of said top level that outputs a signal to said first macro and said second macro, wherein the step of calculating a delay between said top level and said macro further comprises calculating a first delay for a path between said output terminal and said first macro and a second delay for a path between said output terminal and said second macro, the calculating of first and second delays being based on said first delay model and said second delay model.

2. The method of designing a wiring as claimed in claim 1, further comprising: defining an output terminal of said top level that outputs a signal into said macro; and defining an input terminal of said macro that receives said signal from said top level; wherein said top level wiring connects said output terminal to said input terminal.

3. The method of designing a wiring as claimed in claim 2, wherein said providing a delay model comprises adding a buffer logic in a library cell file to said input terminal.

4. The method of designing a wiring as claimed in claim 3 wherein said arranging a macro wiring further comprises arranging a buffer at said input terminal, said buffer corresponding to said buffer logic.

5. The method of designing a wiring as claimed in claim 2, wherein said defining an input terminal further comprises: providing a line connecting said output terminal and a center of said macro; and defining an intersection, of said line and a periphery of said macro, as said input terminal.

6. The method of designing a wiring as claimed in claim 2, wherein said calculating a delay between said top level and said macro is performed by a static timing analysis of a path between said output terminal of said top level and said input terminal of said macro.

7. The method of designing a wiring as claimed in claim 6, wherein said static timing analysis is based on said delay model.

8. The method of designing a wiring as claimed in claim 6, further comprising calculating information comprising a resistance value of said top level wiring, wherein said static timing analysis is based on said information.

9. The method of designing a wiring as claimed in claim 8, wherein said information further comprises a capacitance value of said top level wiring.

10. The method of designing a wiring as claimed in claim 2, wherein said top level comprises a clock net having said output terminal.

11. The method of designing a wiring as claimed in claim 2, wherein said macro comprises a cell, and wherein said arranging a macro wiring further comprises arranging said cell in said macro based on said delay.

12. The method of designing a wiring as claimed in claim 1, further comprising defining a first input terminal of said first macro and a second input terminal of said second macro, the first and second input terminals receiving said signal from said top level, wherein said top level wiring connects said output terminal to said first input terminal and connects said output terminal and said second input terminal.

13. The method of designing a wiring as claimed in claim 12, wherein said defining a first input terminal and second input terminal further comprises: providing a first line connecting said output terminal and a center of said first macro, and a second line connecting said output terminal and a center of said second macro; and defining an intersection of said first line and a periphery of said first macro as said first input terminal, and an intersection of said second line and a second periphery of said macro as said second input terminal.

14. The method of designing a wiring as claimed in claim 12, wherein said calculating a first delay and a second delay is performed by a static timing analysis for a path between said output terminal of said top level and said first input terminal and for a path between said output terminal of said top level and said second input terminal.

15. The method of designing a wiring as claimed in claim 14, wherein said static timing analysis is based on said first delay model and second delay model.

16. The method of designing a wiring as claimed in claim 14, further comprising calculating information comprising a resistance value of said top level wiring, wherein said static timing analysis is based on said information.

17. The method of designing a wiring as claimed in claim 16, wherein said information further comprises a capacitance value of said top level wiring.

18. The method of designing a wiring as claimed in claim 14, further comprising calculating a delay difference between said first delay and said second delay.

19. The method of designing a wiring as claimed in claim 18, wherein said first macro comprises a first cell, and said second macro comprises a second cell, and wherein said arranging said macro wiring further comprises arranging said first cell in said first macro and said second cell in said second macro based on said delay difference.

20. The method of designing a wiring as claimed in claim 12, wherein said arranging a macro wiring, further comprises arranging a first buffer at said first input terminal and a second buffer at said second input terminal.

21. The method of designing a wiring as claimed in claim 20, further comprising providing a third buffer driving said first buffer and said second buffer.

22. The method of designing a wiring as claimed in claim 12, wherein said macro further comprises a third macro, said third macro comprising a third input terminal receiving said signal from said top level, and wherein said top level wiring connects said output terminal to said third input terminal.

23. The method of designing a wiring as claimed in claim 20, further comprising: calculating information comprising a resistance value of said top level wiring; providing a delay value of said third macro based on said information; and providing a delay model of said third macro.

24. The method of designing a wiring as claimed in claim 1, further comprising providing a control circuit supplying a control signal to a logic circuit, said logic circuit controlling a supplying of signals to said first macro and said second macro.

25. A method of designing wiring for a semiconductor device comprising: providing a cock terminal, a first functional block and a second functional block, said clock terminal and said first and second functional blocks being apart from one another, said clock terminal being applied with a clock signal, said first functional block having a first input terminal and a first cell, said second functional block having a second input terminal and a second cell; providing a first wiring connection between said clock terminal and said first input terminal and a second wiring connection between said clock terminal and said second input terminal; providing in said first function block a first buffer having an input end connected to said first terminal and in a second functional block a second buffer having an input end connected to said second input terminal; calculating a first propagation delay of said clock signal through said first wiring connection nd a second propagation delay of said clock signal through said second wiring connection; and arranging said first and second cells respectively in said first and second functional block to connect said first and second cells respectively to output ends of said first and second buggers such that a skew between said first and second propagation delays may be eliminated at said first and second cells.

26. The method as claimed in claim 25, wherein said calculating said first and second propagation delays is performed based on an information on a resistance and a capacitance of said first and second wiring connection.

27. The method as claimed in claim 26, wherein said calculating said first and second propagation delays is performed by a static timing analysis.

28. The method as claimed in claim 25, further comprising: providing a third functional block having a third input terminal and a third cell connected to said third input terminal; providing a third wiring connection between said clock terminal and said third input terminal; and calculating a third propagation delay of said clock signal through said third wiring connection, and wherein said arranging said first and second cells is performed such that a skew between said first, second and third propagation delays may be eliminated at said first, second, and third cells.

* * * * *